United States Patent [19]

Hundt

[11] Patent Number: 5,294,829
[45] Date of Patent: Mar. 15, 1994

[54] IC PACKAGE HAVING DIRECT ATTACH BACKUP BATTERY

[75] Inventor: Michael J. Hundt, Lewisville, Tex.

[73] Assignee: SGS-Thomson Microelectronics, Inc., Carrollton, Tex.

[21] Appl. No.: 958,550

[22] Filed: Oct. 8, 1992

Related U.S. Application Data

[63] Continuation of Ser. No. 669,348, Mar. 14, 1991, abandoned, which is a continuation-in-part of Ser. No. 470,939, Jan. 26, 1990, abandoned.

[51] Int. Cl.⁵ .............. H01L 23/48; H01L 23/02; H01L 23/12; G11C 7/00
[52] U.S. Cl. .................... 257/678; 257/691; 257/692; 257/787; 257/924; 257/666; 365/229; 365/228
[58] Field of Search ............ 357/74, 70, 72, 75; 361/392, 394, 395, 380; 174/52.4; 365/228, 229, 226; 368/203, 204, 205; 257/678, 691, 692, 787, 788, 798, 928, 924, 666

[56] References Cited

U.S. PATENT DOCUMENTS

| 4,763,308 | 8/1988 | Morata | 368/204 |
| 4,992,987 | 2/1991 | Echols et al. | 365/229 |
| 5,055,704 | 10/1991 | Link et al. | 365/229 |

FOREIGN PATENT DOCUMENTS

| 0171089 | 2/1986 | European Pat. Off. | G11C 5/00 |
| 0165152 | 1/1989 | Japan | 357/74 |

OTHER PUBLICATIONS

*Electronics*, "Designer's Dream Machine-Dallas Semiconductor's Microcontroller Updates Itself on the Fly", by Bernard C. Cole, Mar. 5, 1987.

Primary Examiner—Andrew J. James
Assistant Examiner—Carl Whitehead, Jr.
Attorney, Agent, or Firm—Dennis T. Griggs; Richard A. Bachand; Richard K. Robinson

[57] ABSTRACT

A molded device package supports a volatile memory chip and a replaceable backup battery for preserving data in the event of loss of main power supply. The package includes an external socket for receiving a replaceable backup battery which can be manually inserted into or removed from the socket after molding encapsulation and metal trim work have been completed. The socket is intersected by an exposure cavity which permits the positive and negative terminals of a backup battery to engage positive and negative finger leads. The positive and negative battery terminals are engaged by resilient terminal contact portions of the positive and negative finger leads which project into the exposure cavity. Socket shoulder portions and a retainer cap hold a backup battery within the socket and in electrical contact with the resilient terminal contact portions.

11 Claims, 4 Drawing Sheets

IC PACKAGE HAVING DIRECT ATTACH BACKUP BATTERY

CROSS REFERENCE TO RELATED APPLICATION

This is a continuation of copending application Ser. No. 07/669,348 filed on Mar. 14, 1991 which is a continuation-in-part of U.S. application Ser. No. 07/470,939 filed Jan. 26, 1990.

FIELD OF THE INVENTION

This invention relates generally to packaging for semiconductor devices, and in particular to an integrated circuit package which supports a semiconductor memory chip and a backup battery for preserving data in the event of loss of main power supply.

BACKGROUND OF THE INVENTION

Conventional packages for semiconductor integrated circuit chips are adapted to enclose and seal the chip devices, while also providing heat dissipation, structural support, electrical attachment of device leads to external pin connectors, and electrical interconnection with other devices in the package. Such packages usually include one or more layers of a non-conductive material, having a central cavity in which a semiconductor chip is received. Flexible metal leads are extended from the central cavity for connecting the device input/output leads to a printed circuit board in a host electronic circuit.

An important integrated circuit product which is implemented on an IC chip encapsulated within an integrated circuit package includes a volatile semiconductor memory such as the static random access memory (SRAM) which is characterized by low power consumption and high memory cell density. The generation of valid logic signals and the retention of data in such integrated memory circuits having volatile memory cells depend in part on maintenance of power supply voltage within specified limits. In conventional integrated circuit memory devices, internal circuits sense the external voltage being applied to determine if it is sufficient for reliable operation. In response to a low voltage condition, control signals are generated which cause active chips to be deselected and maintained in standby condition. This is usually carried out by means of true and complement chip select signals, CS and cs, respectively, which inhibit read/write operations until the low voltage condition has been corrected.

During the period that a memory chip is in the unselected condition it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be resumed.

DESCRIPTION OF THE PRIOR ART

It has been proposed to solve the data loss problem by using an additional pin terminal on memory semiconductor circuits and that the additional terminal be supplied with backup power from a remote source to maintain the data in the memory cells. However, there are now established standardized pin patterns for most integrated circuit memories; consequently, the addition of another pin dedicated to a remote backup power supply would not be compatible with such standard pin patterns, and would require a substantial redesign of existing circuits.

Accordingly, there exists a need for a semiconductor memory package for supporting a memory chip and a backup battery wherein the socket area and standard pin configuration are not affected, and stored data are retained despite a loss of the main power supply.

A substantial portion of the cost and size of a packaged chip is attributable to package fabrication, and two important design criteria in addition to providing a reliable electrical connection are cost effectiveness and space efficiency. A need thus exists for an improved device package for safely supporting an integrated circuit chip and an on-package backup battery wherein the package is provided with pin connectors formed therein for plug-in compatibility with standard printed circuit sockets, and the packaging space required for supporting the backup battery is minimized.

Some packages for integrated circuit memory devices have included a battery molded within the body of the package. However, when the assembly is heated to the temperature necessary to perform encapsulation, the electrolyte within the backup battery evaporates and the battery charge is dissipated or destroyed. Accordingly, there is continuing interest in developing backup batteries which can withstand the high temperatures encountered during transfer molding and encapsulation. Until such batteries have been perfected, there is a need for an IC chip package which will permit a backup battery to be loaded after molding and encapsulation have been completed.

Although backup batteries are presently available which are rated for backup use for 10 years or more, the user may desire to replace the backup battery from time-to-time. For example, the user may desire a less expensive battery having a shorter life span and replace it from time to time, or replace an on-board backup battery with an improved backup battery when it becomes available. Additionally, the user may desire to substitute a fresh battery for an on-board backup battery which has been discharged by a short circuit or which otherwise has been damaged, for example, by exposure to high temperature operating conditions.

SUMMARY OF THE INVENTION

The present invention provides a package for encapsulating an integrated circuit device and overcomes the foregoing backup power limitations of the prior art by providing an integrally formed external socket for receiving a replaceable backup battery which can be manually inserted into or removed from the socket after molding encapsulation and metal trim work have been completed. In the preferred embodiment, a lead frame assembly including a base plate and multiple finger leads is secured onto a side surface of a first body of non-conductive material during a transfer mold operation. A second molded body of non-conductive material having a chip cavity and a battery cavity is assembled onto the first body, with the chip cavity being positioned in alignment with the base plate of the lead frame assembly. One of the finger leads defines a positive power lead, and one finger lead defines a negative power lead. The second molded body is intersected by an exposure cavity which provides deflection space for projecting terminal portions of the power loads, and also exposes the positive and negative power terminals of a backup battery for electrical contacting engagement by the projecting power lead terminal portions.

The second molded body of non-conductive material includes portions defining a socket for receiving a backup battery of the type having positive and negative polarity contact members. The backup battery is manually insertable into the socket, with its positive and negative polarity contact members being received within the exposure cavity and engaged in electrical contact with the projecting power lead terminal portions. The backup battery is retained by a removable cap which holds the battery within the socket, and maintains positive contacting engagement against the resilient, projecting terminal portions.

Operational features and advantages of the present invention will be appreciated by those skilled in the art upon reading the detailed description which follows in connection with the attached drawings, wherein:

DETAILED DESCRIPTION OF THE PREFERRED EMBODIMENT

Figure 1:
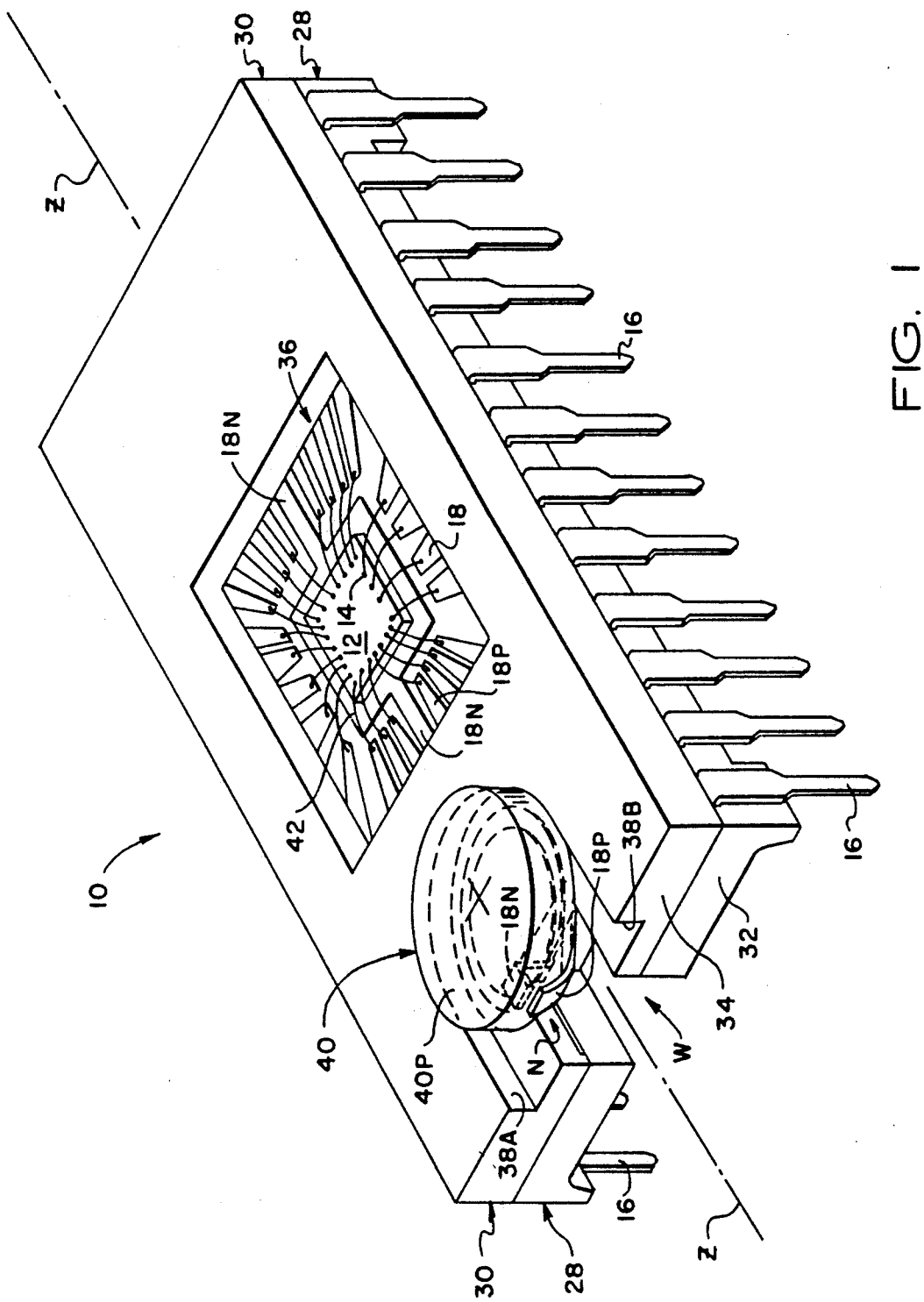
FIG. 1 is a perspective view of an integrated circuit chip package having a replaceable backup battery installed according to the present invention.

In the description which follows, like parts are indicated throughout the specification and drawings with the same reference numerals, respectively. By way of example, the invention is described in combination with a static random access memory (SRAM) which is implemented by monolithic CMOS/LSI techniques on an N-type silicon semiconductor chip. It will be appreciated, however, that the packaging assembly of the invention may be used to encapsulate and provide replaceable backup battery power for discrete as well as integrated devices, and has particular utility for volatile memory integrated circuits having multiple input/output nodes. Accordingly, it should be understood that the invention in its broadest aspects may be incorporated in any moldable package which houses one or more circuit devices requiring backup power, including but not limited to discrete, micro-discrete and integrated circuit components, and hybrid combinations of discrete and integrated devices.

Referring now to FIG. 1, there is shown an exemplary semiconductor chip package 10 incorporating the present invention. The package 10 supports and encapsulates an integrated circuit chip 12 having input/output nodes 14. The IC chip 12 may be, for example, a 2K×8 static random access memory (SRAM) circuit which is characterized by low power consumption, high memory cell density and which is implemented by complementary metal oxide semiconductor (CMOS) technology.

The exemplary package 10 has a conventional dual-in-line pin configuration including 24 external connector pins 16 arranged in two parallel rows with 600 mil spacing along the longitudinal edges of the package. The input/output nodes 14 of the integrated circuit chip 12 are electrically connected to selected connector pins 16 by conductive finger leads 18 of a lead frame assembly 20 as Shown in FIG. 2.

Figure 2:
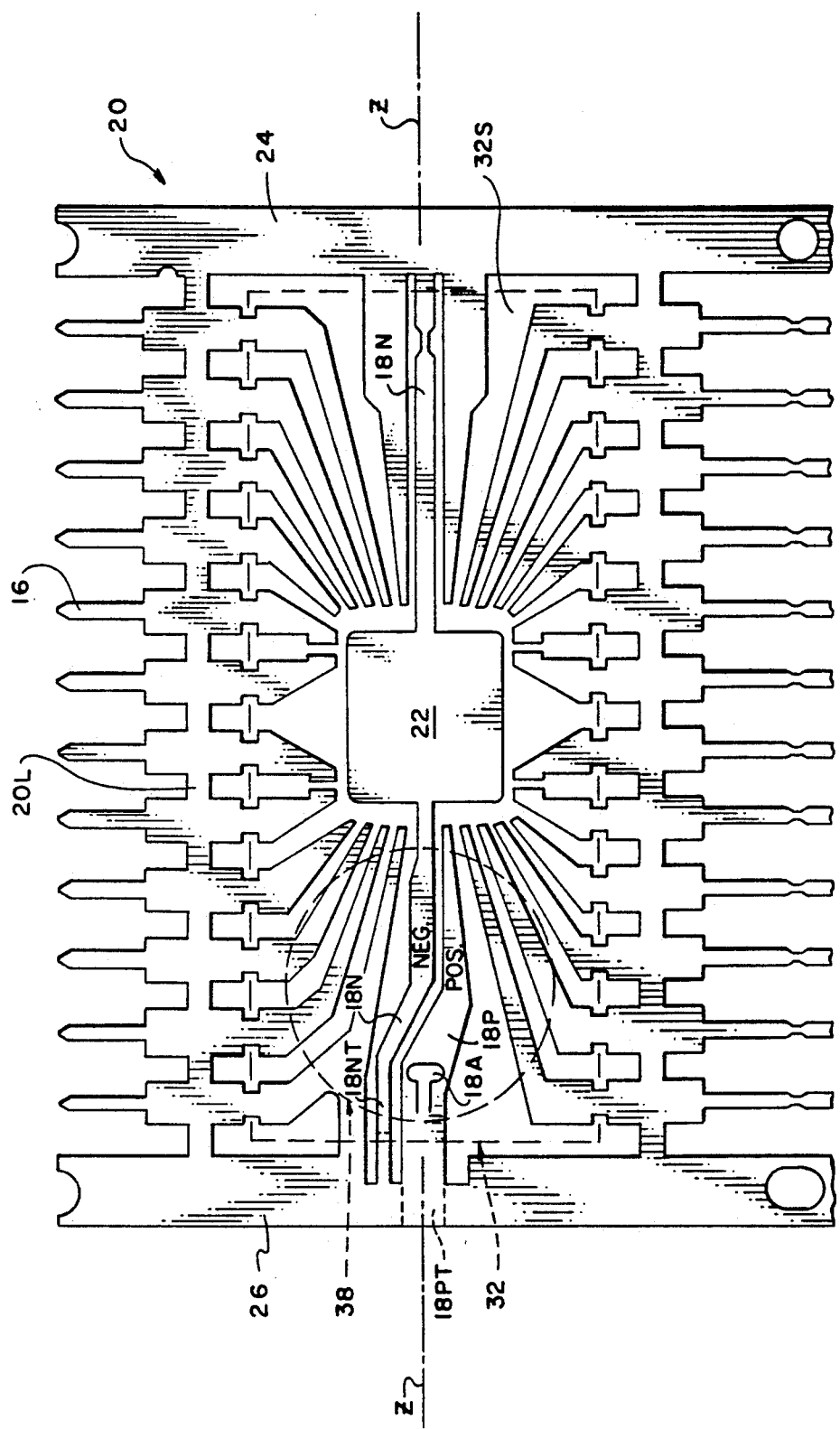
FIG. 2 is a plan view of a lead frame assembly which is incorporated in the semiconductor package of FIG. 1.

Referring to FIG. 2, the inner lead fingers 18 are spaced with respect to a central base plate 22 and are integrally formed with the connector pins 16. Connecting portions 20 of the lead frame assembly are ultimately trimmed away during manufacture whereby each inner lead 18 is electrically connected to a single connector pin 16. Transport side rail strips 24, 26 on the outer perimeter of the lead frame 20 are also cut away during trim and form operations in the last stages of manufacture, after molding has taken place.

The inner tips of the conductive fingers 18 are symmetrically spaced about the base plate 22. The inner tips of the conductive fingers 18 are relatively narrow, and the fingers expand substantially as they radiate outwardly from the base plate 22. The base plate 22, connector pins 16 and inner finger leads 18 are initially coplanar during molding. After molding, the connector pin portions 16 are bent through a 90 degree angle along the longitudinal side surfaces of the package during the trim and form operation.

The semiconductor chip package includes a base subassembly 28 and a cover subassembly 30. The base subassembly 28 includes a nonconductive substrate 32 on which the lead frame 20 (FIG. 2) is mounted. The lead frame 20 has a standard pin pattern for electrically connecting the input/output nodes 14 of the semiconductor chip 12 to a socket on a printed circuit board of a host electronic system or on some other semiconductor package. The cover subassembly 30 includes a nonconductive substrate 34 which is assembled on top of the base substrate 32, and seals the lead frame assembly 20. Additionally, the cover substrate 34 includes a cavity 36 in which the semiconductor chip 12 is received, a socket 38 (FIG. 3) in which a backup battery 40 is received, and a battery terminal access cavity N.

Figure 4:
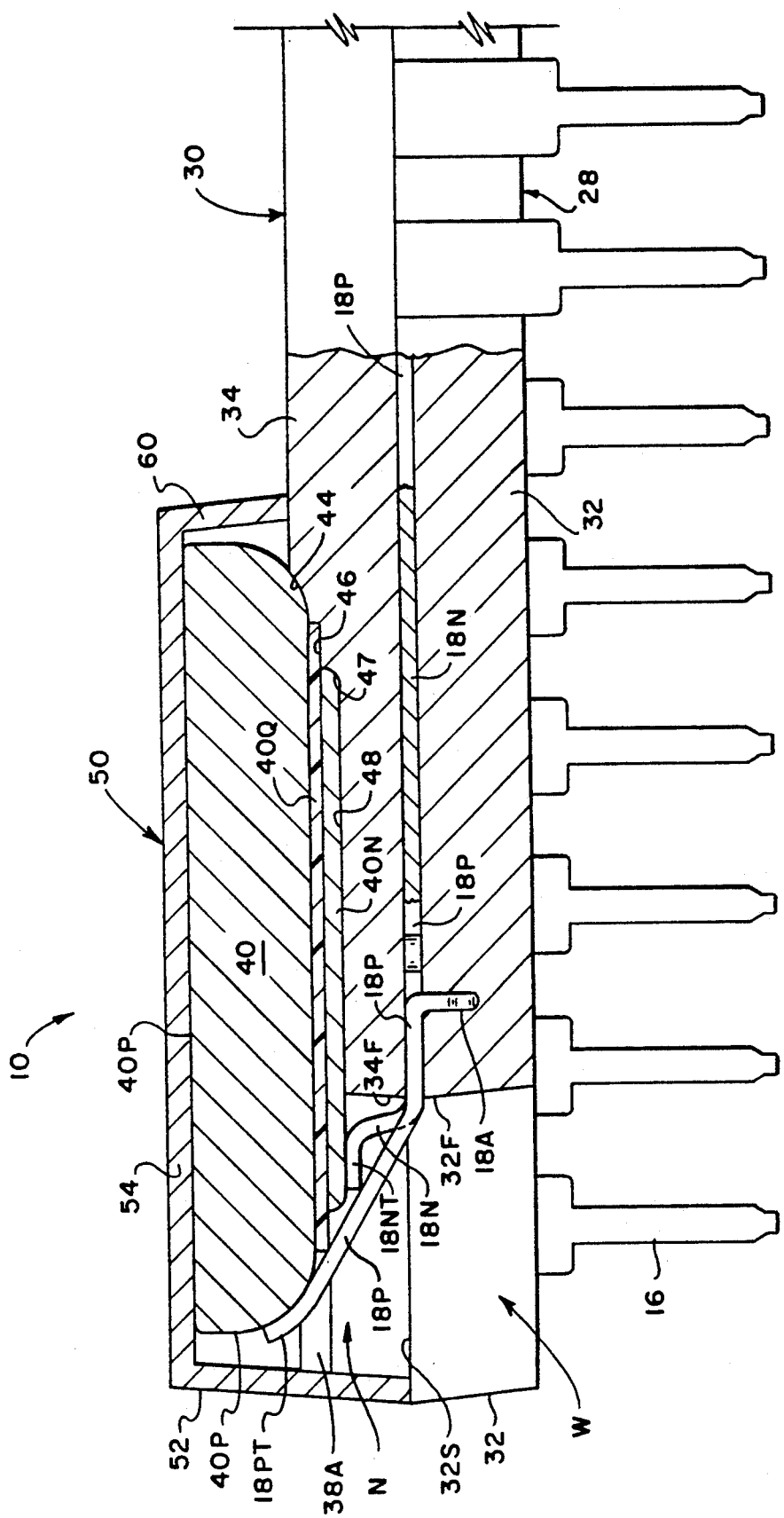

The battery 40 is preferably a 3-volt lithium cell having a 12 mm diameter. The battery 40 has a positive terminal 40P and a negative terminal 40N which is insulated with respect to the positive terminal by an annular layer of dielectric insulation 40Q, as shown in FIG. 4.

The semiconductor chip 12 is bonded to the base plate 22 by a conductive deposit of silver-filled epoxy adhesive such as ABLEBON TM 84-1 and holds the chip 12 securely within the cavity 36. The input/output nodes 14 are electrically connected to selected conductive fingers 18 by fine gold wires 42 having a diameter of 1.3 mil. Bonding of the gold wires 42 to the conductive fingers 18 and I/0 nodes 14 is preferably by the conventional thermosonic ball bonding technique.

After the integrated circuit chip 12 has been bonded to the base plate 22, and the ends of the fine gold wires 42 have been bonded, the lead frame assembly 20 is placed into the bottom half of a multicavity split mold. The mold cavity is closed in a transfer molding machine and a nonconductive encapsulant resin material such as polyphenylene sulfide is injected in fine pellet form from a nozzle. The pressure at which this injection takes place is closely controlled to prevent damage to the wire bonds. Under the appropriate pressure and temperature, for example 200 degrees C., the pellets melt and flow into channels within the mold and fill the cavities around the lead frame assembly 20. The resin is cured while still in the mold by the applied heat and pressure. Further curing takes place in an oven.

As a result of the foregoing mold procedure, the base subassembly 28 is produced in the form of a generally rectangular substrate body 32 of nonconductive material with the lead frame 20 being embedded in flush relation with the top surface 32S of the rectangular body, as shown in FIG. 2. The lead frame 20 is further stabilized onto the base substrate 32 by an anchor tab 18A which is embedded within the body 40 during molding. The anchor tab 18A is integrally formed as a part of the positive finger lead 18P, and is stamped in the form of a T outline as shown in FIG. 2 during fabrication of the lead frame assembly 20. Prior to molding, the anchor tab 18A is turned downwardly through an angle of approximately 90 degrees, thereby securely anchoring the lead frame assembly 20 onto the nonconductive substrate 32. After removal from the mold, the lateral cross pieces 20L between adjacent pins 16 in the lead frame assembly 20 ar cut to separate and electrically isolate the pins 16 and conductive finger strips 18 from one another. Additionally, the transport side sections 24, 26 are also cut and separated from the molded assembly.

The lead frame 20 material is preferably stamped from a flat sheet of resilient metal, such as a tin plated nickel or iron alloy or, alternatively, a tin plated copper alloy such as CDA 194. It will be appreciated that during assembly, the connector pins 16 and inner conductive finger leads 18 are structurally interconnected by the lateral segments 20L and by the side transport sections 24, 26, preferably stamped from the same metal strip. The connecting sections remain attached to the connector pins for handling purposes only and are severed prior to final assembly.

A measured amount of a liquid encapsulating material, such as AMICON ™ XT-5038-9 insulation compound (not shown), is injected into the cavity 36 for sealing and protecting the integrated circuit chip 12, the fine gold wires 42 and the exposed surfaces of the inner finger leads 18. The liquid encapsulating material solidifies upon curing, thereby providing structural cover as well as an environmental seal.

It will be understood that a selected one of the external pins 16 will be connected to a primary power supply node which provides a voltage $V_{cc}$ which is typically +5.0 volts DC. Similarly, another connector pin will be connected to a ground node of a host electronic system for providing a ground reference GND. Other pins are dedicated for true and complement chip select signals, CS and cs, a signal CLK for synchronously clocking data to and from the monolithic integrated circuit 12, as well as various other I/0 signals which are produced by the host electronic circuit and integrated circuit 12. A comparator and switching circuit (not illustrated) compares the voltage $V_{cc}$ from the primary power supply of the host electronic circuit with the voltage of the backup battery 40 and automatically connects the highest detected voltage to power the integrated circuit 12.

According to one aspect of the invention, one of the conductive inner finger leads, designated 18N, is integrally formed with the base plate 22. The finger lead 18N extends across the lead frame support surface 32S generally along the longitudinal axis Z of the base subassembly 32. Another one of the conductive inner finger leads, designated 18P, is radially spaced and isolated from the base plate 22, and also extends generally in alignment with the longitudinal axis Z of the base subassembly 32. The inner conductive finger leads 18P and 18N are adapted for electrical contacting engagement with the positive terminal 40P and negative terminal 40N, respectively, of the replaceable backup battery 40 as illustrated in FIG. 4.

In the preferred embodiment, electrical connection to the positive and negative terminals 40P, 40N of the replaceable backup battery 40 is accomplished by engaging the negative battery terminal 40N against a modified terminal end portion 18NT of the negative conductive lead 18N, as shown in FIG. 4. The positive terminal 40P is electrically engaged by a modified terminal end portion 18PT of the positive inner lead 18P. Referring to FIG. 2, the side rail 26 is cut along the dotted lines shown on leads 18NT and 18PT during a post-molding cut and form operation to provide the projecting terminal end portions 18PT and 18NT.

A notch cavity W and the notch cavity N intersect the nonconductive substrates 32, 34, respectively, to expose the battery terminals 40P, 40N and to accommodate flexure movement of the projecting positive terminal end portion 18pT and the projecting negative terminal end portion 18NT. The resilient body of the positive finger lead 18P is bent transversely through the notch N as shown in FIG. 4, and the terminal end portion 18PT is curved about the curved side surface of the positive battery terminal 40P. The terminal end portion 18PT applies a spring bias force against the exposed positive electrode contact surface 40P of the backup battery 40. The resilient body of the negative finger lead 18N is bent through a right angle and projects substantially vertically through the upper notch N. The terminal end portion 18NT is bent through a right angle relative to the finger lead body 18N, and applies a spring bias force against the exposed negative contact electrode surface 40N of the battery 40. The exposed electrodes of the backup battery 40 are therefore positively engaged for good electrical contact.

In one embodiment of the invention, the nonconductive cover substrate 34 is separately molded in a transfer molding machine in which nonconductive encapsulation resin material such as polyphenylene sulfide is injected. The mold cavity is provided with the appropriate mold structure to produce the chip cavity 36, the battery socket cavity 38 and the notch N. After molding, the cover substrate 34 is securely bonded onto the base substrate support surface 32S with the integrated circuit chip 12 being centered within the chip cavity 36, and with the notch W providing access to the positive and negative finger leads 18P, 18N. The cover substrate 34 is bonded onto the base substrate support surface 32S by any suitable means such as adhesives, ultrasonic welding or staking. Accordingly, the interface between the base substrate 32 and the cover substrate 34 is tightly sealed.

Figure 3:
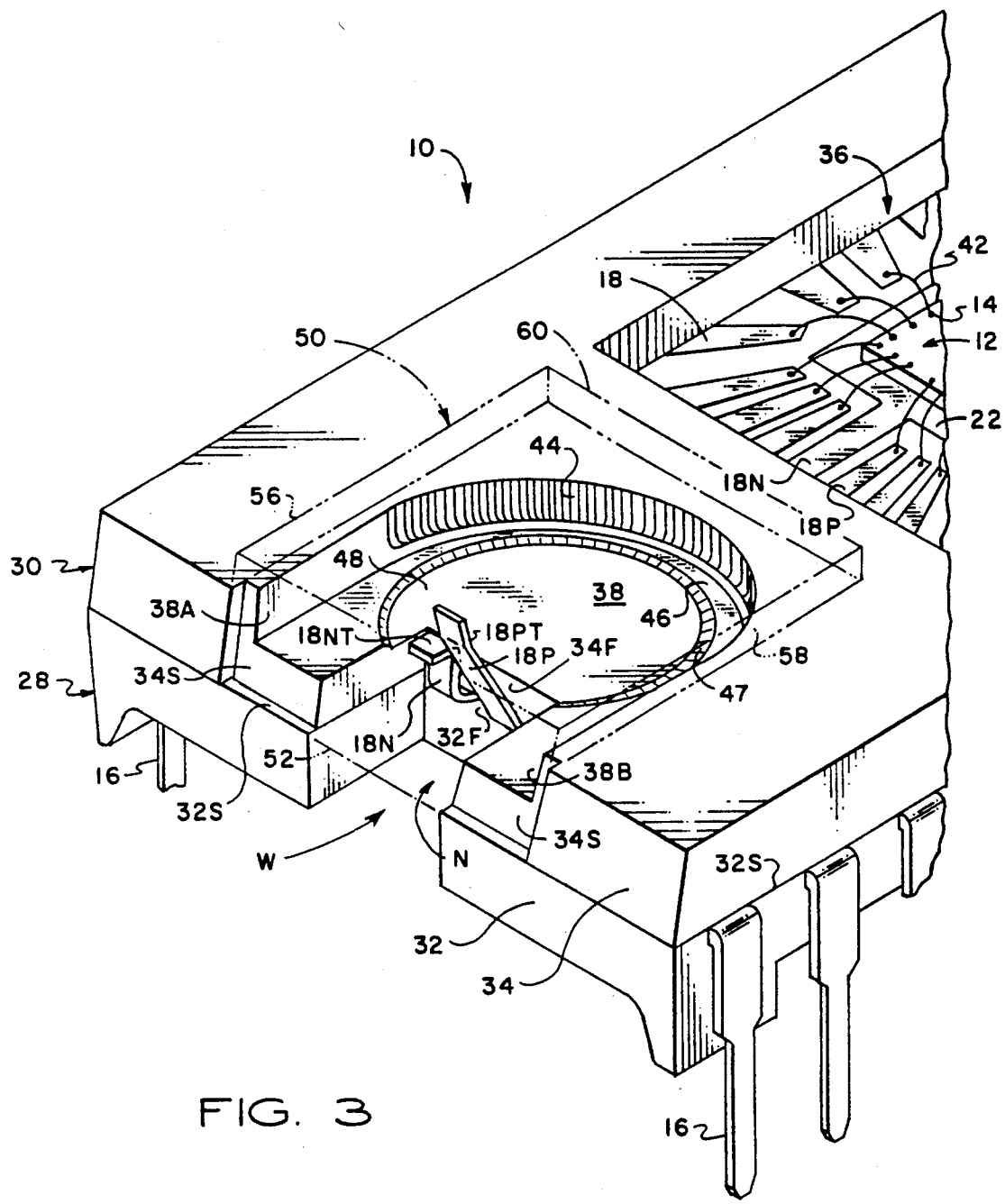
FIG. 3 is a perspective view of the semiconductor package shown in FIG. 1, partially broken away, with the backup battery removed from its socket; and, FIG. 4 is a side elevational view, partially broken away and partially in section, of the integrated circuit package of FIG. 1.

Referring now to FIG. 3 and FIG. 4, the battery socket 38 opens into the upper notch N, which exposes the conductive side surface of the battery terminal 40P, and a portion of the negative terminal 40N. The socket 38 is bounded on one end by a concave shoulder 44 (FIG. 3) which is conformed for surface engagement against the curved external side surface of the positive battery terminal 40P. The socket 38 also has an annular face 46, which is engagable against the insulation layer 40Q. An annular, beveled face 47 provides a conforming transition between the annular planar face 46 and the planar floor surface 48. The planar floor surface 48 of the battery socket 38 engages the negative battery terminal 40N. The socket sidewalls 38A, 38B provide transverse support for the battery, and have a transverse spacing for receiving a battery having a 12 mm diameter.

During the step of inserting or removing the battery 40, the positive power lead terminal portion 18PT is deflected outwardly, to permit the battery to be inserted or removed. Upon release, the positive terminal portion 18PT and the negative portion 18NT spring upwardly and apply a bias engaging force against the positive (anode) battery terminal 40P and negative (cathode) battery terminal 40N, respectively.

The battery 40 is retained within the socket 38 in positive, electrically contacting engagement with the anode terminal portion 18PT and the cathode terminal portion 18NT by a removable cap 50. The cap 50 has a forward panel 52 which is received within a slot 34S which intersects the upper substrate 34 on opposite sides of the upper notch N. The cap 50 also has a top panel which is engaged in surface contact with the planar top surface 40P of the backup battery 40. The top panel 54 is offset with respect to the top surface of the cover substrate 34 by a left side panel 56, a right side panel 58 and a rear panel 60.

The retainer cap 50 is attached to the cover substrate 34 by any suitable means such as adhesives, ultrasonic welding, pin fasteners, or staking. Accordingly, the battery 40 is securely retained within the socket 38, and the spring bias force applied by the positive finger lead 8 and by the negative finger lead 18N produces reliable electrical contacting engagement with the positive and negative battery electrodes. Other connecting arrangements may be used to secure the retainer cap 50 onto the upper substrate 34. For example, the base substrate 32, the cover substrate 34 and retainer cap 50 can be fitted with mutually coacting male and female fasteners which provide snap detent interlocking engagement when pressed together.

Because the positive finger lead 18P and the negative finger lead 18N are exposed by the notches W, N, an encapsulating material such as AMICON TM XT-5038-9 insulation compound (not shown) is applied to the substrate faces 32E, 34F surrounding and between the exposed leads and forms a protective insulating layer. The insulating layer prevents the formation of conductive bridges across the exposed adjacent finger leads 18P, 18N which might otherwise occur upon exposure to corrosive vapors and/or condensate.

Although the exemplary embodiment illustrated in FIGS. 1-4 utilizes a separately molded base subassembly 28 and a separately molded cover subassembly 30, it will be understood by those skilled in the art that the base subassembly substrate 32 may be integrally formed with the cover subassembly substrate 34 during molding. In such an integral body molding operation, the lead frame assembly 20 is placed into the bottom half of a multicavity split mold, in engagement with appropriately formed standoff structures and cavities to define the socket 38, the cap slot 34S, the notches W, N and the socket shoulders 38, 38B. In the integrally molded embodiment, the chip cavity 36 is not required, and the pressure in which the injection of the nonconductive encapsulant material takes place is closely controlled to prevent damage to the gold wire bonds, with the result that the integrated circuit chip 12, the gold wires 42 and the inner end portions of the finger leads 18 are completely encapsulated. Post-molding fabrication of the integrally molded package is otherwise the same, with the positive and negative finger lead terminal end portions 18PT and 18NT being cut, formed and bent into the battery retaining configuration within the notches W, N as shown in FIG. 3 and FIG. 4.

Although the invention has been described with reference to certain specific embodiments, and with reference to a package which encapsulates and provides replaceable backup battery power for an integrated circuit device, the foregoing description is not intended to be construed in a limiting sense. Various modifications of the disclosed premolded replaceable battery package as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. A package for containing a semiconductor integrated circuit comprising:
    a first nonconductive body;
    a lead assembly carried on said first nonconductive body, said lead assembly including a plurality of conductive finger leads, one of said finger leads providing a positive power lead and another of said finger leads providing a negative power lead, said positive and negative power leads having resilient terminal lead portions;
    a semiconductor integrated circuit carried on said nonconductive body, said electronic circuit device having positive and negative power nodes electrically coupled to said positive and negative power leads, respectively; and,
    a second nonconductive body mounted onto said first nonconductive body and sealing a portion of said lead frame between said first and second nonconductive bodies, said second nonconductive body having a socket for receiving a user replaceable backup battery, said positive and negative resilient terminal lead portions being exposed within said socket for directly electrically engaging positive and negative power terminals of a backup battery when the backup battery is loaded into said socket; whereby when the backup battery is inserted into said socket, said backup battery can supply backup electrical power to said electronic circuit device.

2. The package of claim 1 wherein said backup battery has a first power terminal engaged in electrical contact with the projecting terminal portion of the positive power lead, and has a second power terminal engaged in electrical contact with the projecting terminal portion of the negative power lead.

3. The package of claim 1 wherein the finger lead assembly includes a base plate, and wherein a selected one of said finger leads which provides a power lead is electrically connected to said base plate, said integrated circuit device including a power node electrically coupled to said base plate.

4. The package of claim 3 wherein said selected finger lead and said base plate are integrally formed.

5. The package of claim 1 wherein said second nonconductive body has a battery terminal support surface within said socket.

6. The package of claim 1 wherein one of said finger leads has an anchor tab portion embedded in said first nonconductive body.

7. The package of claim 1 further comprising a retainer on said second nonconductive body having a portion overlying said socket for engaging the battery loaded into said socket.

8. The package of claim 7 wherein said retainer is a cap having a top panel for engaging the battery loaded into said socket and having side panels adapted for attachment to said second nonconductive body.

9. The package of claim 1 wherein said lead assembly includes a base plate to which one of said conductive finger leads is electrically connected, wherein said integrated circuit device is an LSI semiconductor integrated circuit mounted on said base plate and having a plurality of input/output nodes, and wherein a plurality of wire conductors connect said input/output nodes to said conductive finger leads.

10. An integrated circuit device package assembly comprising:
   a first insulating body having a support surface;
   a plurality of conductive leads carried on said support surface with one of said leads providing a positive power lead having a terminal contact lead portion projecting from said first insulating body and another of said leads providing a negative power lead having a terminal contact lead portion projecting from said first insulating body;
   a second insulting body on said first insulating body with a portion of said leads sealed therebetween, said second insulating body having a cavity for receiving an electronic circuit device, and having a socket for receiving a user loadable backup battery;
   an electronic circuit device in said cavity and having a plurality of input/output nodes electrically connected to said conductive leads; and
   the positive and negative power terminal contact lead portions being exposed within said socket for respectively directly engaging positive and negative terminals of a backup battery when the backup battery is loaded into said socket;
   whereby when a backup battery is loaded into said socket, said backup battery can supply backup electrical power to said electronic circuit device.

11. In an integral electronic circuit package of the type including a circuit device having multiple input/output nodes encapsulated within a body of nonconductive material, a plurality of connector pins mounted on said body of nonconductive material and projecting externally thereof, and a plurality of conductive finger leads encapsulated within said body of nonconductive material electrically connecting said input/output nodes to said connector pins, the improvement comprising:
   said body of nonconductive material having a cavity defining a socket for receiving positive and negative terminals of a backup battery;
   one of said conductive finger leads providing a first power lead having a terminal contact portion projecting into said socket, the projecting terminal contact portion of the first power lead being disposed for direct electrical contacting engagement with the positive terminal of the backup battery when the backup batter is loaded into said socket; and,
   another of said conductive finger leads providing a second power lead having a terminal contact portion projecting into said socket, the projecting terminal contact portion of the second power lead being disposed for direct electrical contacting engagement with the negative terminal of the backup battery when the backup battery is loaded into said socket;
   whereby when the backup battery is loaded into said socket, said backup battery can supply backup electrical power to said circuit device.

* * * * *